(12) United States Patent
Iijima et al.

(10) Patent No.: US 7,074,669 B2
(45) Date of Patent: Jul. 11, 2006

(54) SEMICONDUCTOR INTEGRATED CIRCUIT DEVICE WITH CAPACITOR OF CROWN STRUCTURE AND METHOD OF MANUFACTURING THE SAME

(75) Inventors: Shinpei Iijima, Tokyo (JP); Hiroshi Sakuma, Tokyo (JP)

(73) Assignee: Elpida Memory,Inc., Tokyo (JP)

( * ) Notice: Subject to any disclaimer, the term of this patent is extended or adjusted under 35 U.S.C. 154(b) by 0 days.

(21) Appl. No.: 10/443,572

(22) Filed: May 22, 2003

(65) Prior Publication Data

US 2003/0224571 A1 Dec. 4, 2003

(30) Foreign Application Priority Data

May 28, 2002 (JP) .............................. 2002-154680

(51) Int. Cl.
*H01L 21/8242* (2006.01)

(52) U.S. Cl. ........................ 438/253; 438/255; 438/396
(58) Field of Classification Search .................... 438/3, 438/238–240, 253–256, 381, 396–399
See application file for complete search history.

(56) References Cited

U.S. PATENT DOCUMENTS

| 2001/0041402 A1* | 11/2001 | Yamamoto | 438/238 |
| 2002/0146882 A1* | 10/2002 | Hong | 438/240 |
| 2002/0192896 A1* | 12/2002 | Matsui et al. | 438/239 |

FOREIGN PATENT DOCUMENTS

| JP | 11-274431 | 10/1999 |
| JP | 2000-150827 | 5/2000 |

* cited by examiner

*Primary Examiner*—H. Jey Tsai
(74) *Attorney, Agent, or Firm*—Katten, Muchin Rosenman LLP

(57) ABSTRACT

A semiconductor integrated circuit device includes a plurality of capacitor elements, which are separated from each other by a first insulating film on a plane. Each of the plurality of capacitor elements has a lower electrode, a dielectric film, and an upper electrode, and the lower electrode has a crown structure. At least one of the lower electrode and the upper electrode has a laminate structure composed of a plurality of conductive films. An outermost film of the laminate structure on a side of the dielectric film is a ruthenium film, and a portion of the laminate structure other than the outermost film has higher selective growth than the first insulating film with respect to the ruthenium film. Here, the first insulating film is desirably a tantalum oxide film.

5 Claims, 15 Drawing Sheets

RUTHENIUM FILM 222

TANTALUM OXIDE FILM 125

POLYSILICON FILM 221
TANTALUM OXIDE FILM 305

RUTHENIUM FILM 222
305

SEMICONDUCTOR INTEGRATED CIRCUIT DEVICE WITH CAPACITOR OF CROWN STRUCTURE AND METHOD OF MANUFACTURING THE SAME

BACKGROUND OF THE INVENTION

1. Field of the Invention

The present invention relates to a semiconductor integrated circuit device. Particularly, the present invention relates to a semiconductor integrated circuit device, which has a capacitor of a crown structure and a method for manufacturing the same.

2. Description of the Related Art

A MIS (Metal-Insulator-Semiconductor) structure is used for capacitors of DRAMs commercially available at present. In order to achieve high integration as the product generation progresses, the area of a memory cell is reduced and a plane area or a space allowed to form a capacitor is also reduced. However, reliable DRAM operation requires a sufficient capacitance of the capacitor.

As is generally well known, the capacitance of a capacitor is dependent on the area of an electrode and a dielectric constant of a dielectric layer. In order to enlarge the effective area of an electrode, a method of providing unevenness on the surface of a silicon lower electrode comes into practice. In order to improve the dielectric constant, a method of using materials with a high dielectric constant such as tantalum oxide for the dielectric layer comes into practice. Although higher integration is requested, it is difficult to secure a sufficient space for the unevenness on the surface of the lower electrode. Also, the improvement of the dielectric constant by using tantalum oxide has a limitation when the lower electrode is formed of silicon.

In case of the MIS structure of the lower electrode of silicon and the dielectric layer of tantalum oxide, a silicon oxide layer with a low dielectric constant is inevitably formed at the boundary between the silicon lower electrode and the tantalum oxide layer. To solve such a problem, it is under consideration to use the MIM structure which has a metal lower electrode. However, increase in leakage current occurs as a new problem in the case of the MIM structure. Especially, metals and metal compounds such as titanium nitride and tungsten, which are already used in manufacturing semiconductor devices, are easy to be oxidized. Therefore, it is difficult to reduce the leakage current between dielectric layer of tantalum oxide and the metal electrode.

In order to avoid this problem, it is effective to form lower electrode by the use of materials such as platinum, ruthenium, and iridium, which are relatively hard to be oxidized. Moreover, it is essential for manufacturing an actual 3-dimensional structure of capacitor that a film of such a material can be formed by using a CVD method from the viewpoint of sufficient coverage and is easy to process or work. Ruthenium is the most promising material which fulfills these requirements.

As schematically shown in FIG. 1, when a crown structure consisting of ruthenium is formed, the crown structure loses a support section during a wet etching so that the crown structure is broken or collapsed. As a result, the production yield remarkably decreases. This phenomenon is conspicuous specifically in case that the crown structure is vibrated in the etching liquid. Also, this phenomenon sometimes occurs in a heat-treat process when an insulating film is formed on the crown structure.

Also, when a ruthenium film is formed by the CVD in practice, unevenness of the film is conspicuous, so that a thin portion appears locally, and many voids exist within the film. Thus, the formed ruthenium film is weak in mechanical strength. When a lower electrode of the crown structure is formed in this condition, problems such as break and collapse of the structures occur, which makes it difficult to ensure the production yield.

FIG. 2A schematically shows an observation of the cross section of a ruthenium film by a transmission electron microscope immediately after a ruthenium film is formed by the CVD method. The observed sample was prepared by forming a ruthenium film (not shown) of 5-nm thickness as crystal seed by a sputtering method after a silicon oxide film 502 was formed on the surface of a silicon substrate 501 and by forming a ruthenium film 503 by the CVD method to have the thickness of 30 nm. The formed ruthenium film 503 appeared flat when the formed ruthenium film 503 was observed by a scanning electron microscope in the magnification of about 200,000 times. However, when the magnification was increased to about 4,000,000 times, it was observed by the transmission electron microscope that the ruthenium film 503 grew selectively in a pillar shape and was not a continuous film, as shown in FIG. 2A. There are many vacant spaces around each pillar. In this case, most of the pillars does not extend in a vertical direction and grew inclined so that the neighboring ones of the pillars contact each other at the upper portion.

When such a ruthenium film is heat-treated, the ruthenium film is fluidized to form a continuous film, as shown in FIG. 2B. The sufficiently continuous film can be formed at about 400° C. At this time, the vacant spaces between the pillars are taken into the continuous film through the heat-treatment and remain as voids 505. Also, the film thickness of the continuous film is not uniform and many thin portions exist even after the heat-treatment. In an extreme case, a portion with no ruthenium appears as a defect 506. In this way, the formed ruthenium film lacks the mechanical strength due to the existence of these voids within the film and the relatively thin portion, which causes break and collapse of the ruthenium crown structure.

In conjunction with the above description, a semiconductor memory device with a crown structure is described in Japanese Patent Application Laid Open (JP-P2000-150827A). In this conventional example, a lower electrode is formed of amorphous silicon or polysilicon, and a dielectric film is formed from an oxide film or a nitride film-oxide film. The use of a ruthenium film is not described.

Also, a semiconductor memory device with a crown structure is described in Japanese Patent Application Laid Open (JP-A-Heisei 11-274431). In this conventional reference, an electrode is formed of titanium nitride and a dielectric film is formed of tantalum oxide. Also, a ruthenium film is formed on a titanium nitride film in an example of this reference. In the structure of the example, a base metal electrode is used for the sake of oxidation resistance and unevenness is provided on the base metal electrode to enlarge the surface area, and a ruthenium film is provided on the electrode. To achieve the structure, the following processes are carried out: (1) unevenness is provided on the base metal electrode by a wet etching, and (2) a ruthenium film is grown by the CVD method.

However, it is difficult to control the processes because the unevenness is formed by applying a wet-etching method to the electrode itself. In an extreme case, penetrating portions are formed in some etching portions of the electrode because the etching is carried out at both sides of the electrode, resulting in the remarkable loss of the mechanical strength. In order to form unevenness with a large enough size to embody the effect while avoiding such problems, the electrode before the etching needs to have a sufficient thickness, e.g. a thickness more than 100 nm. In such a case, however, holes of the electrode disappear. Therefore, such a structure is unsuitable for a semiconductor integrated circuit in which a high integration is required.

SUMMARY OF THE INVENTION

Therefore, an object of the present invention is to provide a highly-integrated semiconductor integrated circuit device with a capacitor of a crown structure, in which a ruthenium film is formed on the outermost surfaces of the crown structure, and to provide a method for manufacturing the same.

Another object of the present invention is to provide a semiconductor integrated circuit device with a capacitor in which a ruthenium film having no voids and formed as uniformly as possible is used as an electrode film, and to provide a method for manufacturing the same.

Another object of the present invention is to provide a semiconductor integrated circuit device with a capacitor of a crown structure in which leakage current can be prevented or reduced, and to provide a method for manufacturing the same.

Another object of the present invention is to provide a semiconductor integrated circuit device with a capacitor in which an insulating film is formed to prevent leakage current to a laminate structure of conductive films as a lower electrode, and to provide a method for manufacturing the same.

Another object of the present invention is to provide a semiconductor integrated circuit device, which can keep a sufficient capacitance with a smaller area or less volume, and to provide a method for manufacturing the same.

Another object of the present invention is to provide a semiconductor integrated circuit device in where unnecessary films can be removed by anisotropic dry etching, and to provide a method for manufacturing the same.

Another object of the present invention is to provide a semiconductor integrated circuit device in which a metal film can be formed selectively on a conductive film, and to provide a method for manufacturing the same.

In an aspect of the present invention, a semiconductor integrated circuit device includes a plurality of capacitor elements, which are separated from each other by a first insulating film on a plane. Each of the plurality of capacitor elements has a lower electrode, a dielectric film, and an upper electrode, and the lower electrode has a crown structure. At least one of the lower electrode and the upper electrode has a laminate structure composed of a plurality of conductive films. An outermost film of the laminate structure on a side of the dielectric film is a ruthenium film, and a portion of the laminate structure other than the outermost film has higher selective growth than the first insulating film with respect to the ruthenium film.

Here, the first insulating film is desirably a tantalum oxide film.

Also, the crown structure of each of the plurality of capacitor elements may be formed on a second insulating film, and the first insulating film may be formed on the second insulating film between the crown structures. In this case, a lower side portion of the crown structure may be covered with the first insulating film and the second insulating film.

Also, the lower electrode may include a conductive polysilicon film, or the lower electrode may include a conductive polysilicon film and a metal silicide film covering the conductive polysilicon film.

Also, an opening area of the crown structure is equal to or less than 0.07 $\mu m^2$.

In another aspect of the present invention, a semiconductor integrated circuit device includes a plurality of capacitor elements, each which has a lower electrode, a dielectric film, and an upper electrode. The lower electrode has a crown structure. At least one of the lower electrode and the upper electrode has a laminate structure of a plurality of conductive films, and a top portion of the crown structure has an insulating film putted between outermost conductive films.

Here, the outermost conductive film is a ruthenium film. Also, the plurality of capacitor elements are separated from each other by a first insulating film on a plane. The crown structure may be formed on a second insulating film, and the first insulating film may be formed on the second insulating film between the crown structures. In this case, a lower side portion of the crown structure may be covered with the first insulating film and the second insulating film.

Also, the lower electrode may include a conductive polysilicon film, or may include a conductive polysilicon film and a metal silicide film covering the conductive polysilicon film. Instead, the lower electrode may include a metal film or a metal compound film.

Also, an opening area of the crown structure is equal to or less than 0.07 $\mu m^2$.

In another aspect of the present invention, a method of manufacturing a semiconductor integrated circuit device, is achieved by (a) forming a second insulating film on a first insulating film; by (b) removing the second insulating film partially; and by (c) forming a lower electrode on the first insulating film exposed after the second insulating film is removed partially. The lower electrode may have a crown structure and include a plurality of conductive films. The outermost film of the lower electrode is a ruthenium (RU) film, and a portion of the lower electrode other than the outermost film is a central film, and the central film may have higher selective growth of the ruthenium film than the second insulating film. The method is achieved by (d) forming a dielectric film on a surface of the crown structure and on the second insulating film between the crown structures; and by (e) forming an upper electrode on the dielectric film.

Here, the step of (b) removing may be achieved by (f) forming a third insulating film on the second insulating film; and by (g) forming a plurality of holes passing through the second insulating film and the third insulating film to the first insulating film. Also, the step of (c) forming the lower electrode may be achieved by (h) forming the central film on an inner wall of each of the plurality of holes on the third insulating film; by (i) removing the central film on the third insulating film; by (j) removing the third insulating film; and by (k) forming the ruthenium film on the central film. In this case, the step of (h) forming the central film may be achieved by forming an amorphous silicon film on the inner wall of each of the plurality of holes and on the third insulating film; and by forming a conductive polysilicon film by heat-treating the amorphous silicon film. Also, the step of (c) forming the lower electrode may further be achieved by forming silicide on a surface of the conductive polysilicon film.

Also, the second insulating film is desirable to be a tantalum oxide film, and the step of (k) forming the ruthenium film may be achieved by growing the ruthenium film on the central film without growing on the second insulating film based on a difference in a growth rate.

Also, the step of (k) forming the ruthenium film may be achieved by depositing the ruthenium film; and by (l) removing the deposited ruthenium film from the second insulating film. In this case, the step of (l) removing the ruthenium film may be achieved by selectively removing the ruthenium film deposited on the second insulating film between the crown structures by a dry etching based on a difference between an opening area of the crown structure and an area on the second insulating film between the crown structures. Also, the step of (c) forming the lower electrode may be achieved by oxidizing a top portion of the central film of the crown structure by heating in an oxidizing atmosphere.

Also, the step of (k) forming the ruthenium film may be achieved by forming a first ruthenium film as a seed crystal layer by a sputtering; and by forming a second ruthenium film by a CVD method on the first ruthenium film. In this case, the step of (k) forming the ruthenium film may be achieved by heat-treating the first ruthenium film and the second ruthenium film to form the ruthenium film.

Also, the step of (g) forming the plurality of holes may be achieved by forming the plurality of holes to reach an inside of the first insulating film.

In another aspect of the present invention, a method of manufacturing a semiconductor integrated circuit device, is achieved by (a) forming a second insulating film on a first insulating film; by (b) removing the second insulating film partially; by (c) forming a lower electrode on the first insulating film exposed after the second insulating film is removed partially, the lower electrode having a crown structure and may include a plurality of conductive films, wherein a top portion of the crown structure has a oxide film put between outermost layers of the plurality of conductive films and a portion of the lower electrode other than the outermost layers is a central film; by (d) forming a dielectric film on the crown structure and on the second insulating film between the crown structures; and by (e) forming an upper electrode on the dielectric film.

Here, the outermost layers of the lower electrode may be a ruthenium (RU) film.

Also, the step of (b) removing may be achieved by (f) forming a third insulating film on the second insulating film; and (g) forming a plurality of holes passing through the second insulating film and the third insulating film to the first insulating film. The step of (c) forming the lower electrode may be achieved by (h) forming the central film on an inner wall of each of the plurality of holes on the third insulating film; by (i) removing the central film on the third insulating film; by (j) removing the third insulating film; and by (k) forming the ruthenium film on the central film. In this case, the step of (h) forming the central film may be achieved by forming an amorphous silicon film on the inner wall of each of the plurality of holes and on the third insulating film; and by forming a conductive polysilicon film by heat-treating the amorphous silicon film. Also, the step of (c) forming the lower electrode further may be achieved by forming silicide on a surface of the conductive polysilicon film.

Also, the second insulating film is a tantalum oxide film, and the step of (k) forming the ruthenium film may be achieved by growing the ruthenium film on the central film without growing on the second insulating film based on a difference in a growth rate.

Also, the step of (k) forming the ruthenium film may be achieved by depositing the ruthenium film; and by (l) removing the deposited ruthenium film from the second insulating film.

Also, the step of (l) removing the ruthenium film may be achieved by selectively removing the ruthenium film deposited on the second insulating film between the crown structures by a dry etching based on a difference between an opening area of the crown structure and an area on the second insulating film between the crown structures. In this case, the step of (c) forming the lower electrode may be achieved by oxidizing a top portion of the central film of the crown structure by heating in an oxidizing atmosphere.

Also, the step of (k) forming the ruthenium film may be achieved by forming a first ruthenium film as a seed crystal layer by a sputtering; and by forming a second ruthenium film by a CVD method on the first ruthenium film. In this case, the step of (k) forming the ruthenium film may be achieved by heat-treating the first ruthenium film and the second ruthenium film to form the ruthenium film.

Also, the step of (g) forming the plurality of holes may be achieved by forming the plurality of holes to reach an inside of the first insulating film.

DESCRIPTION OF THE PREFERRED EMBODIMENTS

Hereinafter, a semiconductor integrated circuit device of the present invention will be described in detail with reference to the attached drawings.

Figure 1:
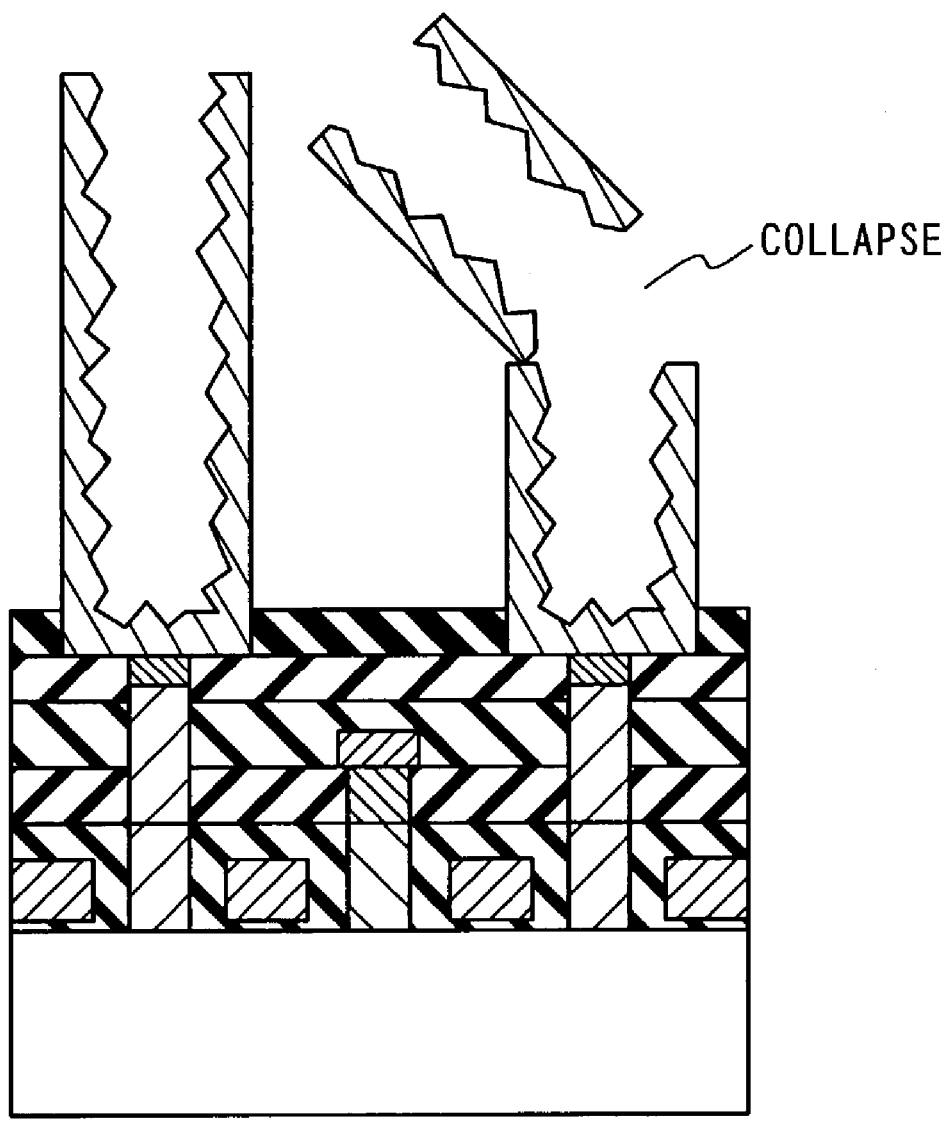
FIG. 1 is a cross-sectional view showing a ruthenium film which is broken or collapsed in a process of manufacturing a semiconductor integrated circuit device in a conventional example.
Figure 2A:
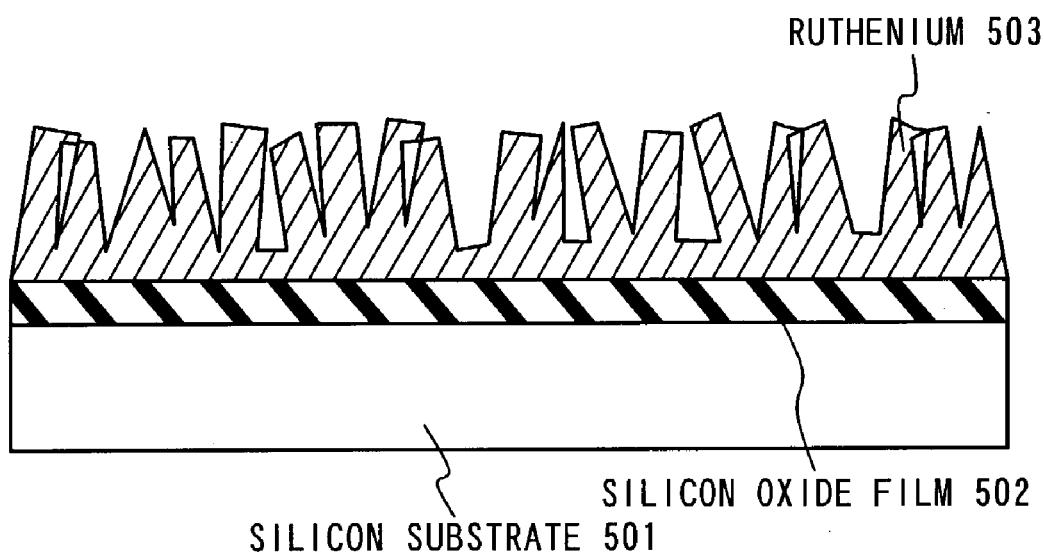
FIGS. 2A and 2B are cross-sectional views showing a ruthenium film immediately after being formed and a ruthenium film after being heat-treated.
Figure 2B:
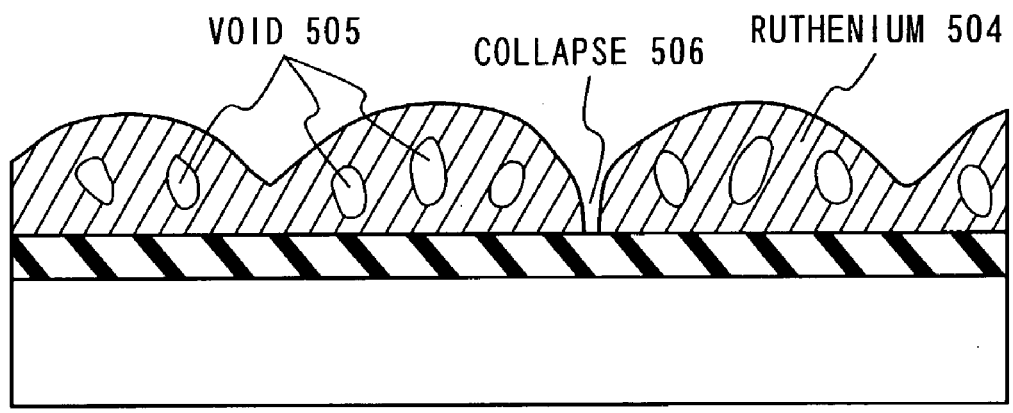
Figure 3:
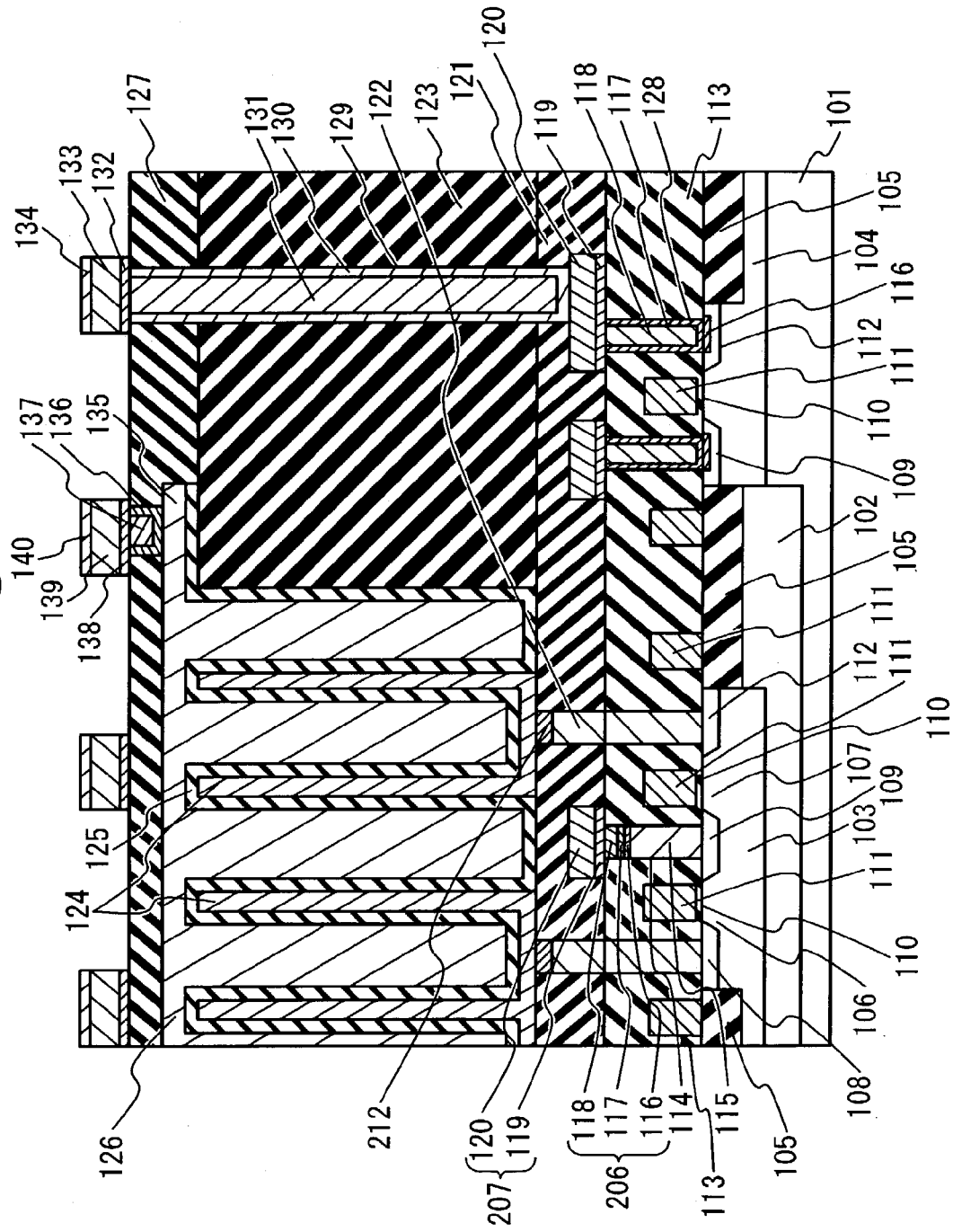
FIG. 3 is a cross-sectional view showing a semiconductor integrated circuit device according to a first embodiment of the present invention.

First of all, the structure of a semiconductor integrated circuit device will be described with reference to FIG. 3.

A N-well 102 is formed on a P-type silicon substrate 101 and a first P-well 103 is formed in the N-well 102. Also, a second P-well 104 is formed on the silicon substrate 101 in an area other than the N-well 102. A device separation region 105 is formed on the surface of the N-well 102. The first P-well and the second P-well indicate a memory array area where a plurality of memory cells are arranged, and a peripheral circuit area, respectively.

Switching transistors 106 and 107 for word lines are formed on the first P-well. The transistor 106 has a drain 108, a source 109, and a gate electrode 111 formed via a gate insulating film 110. The transistor 107 has a drain 112, a source 109, and a gate electrode 111 formed via a gate insulating film 110. The transistor 106 and the transistor 107 share the source 109. The transistors are covered with an interlayer insulating film 113.

A contact hole 114 is formed in a predetermined region of the interlayer insulating film 113 to reach the source 109, and then a bit line contact portion is formed. The bit line contact portion is composed of a first silicon plug 115 formed of a conductive polysilicon and a bit line contact 206 which fill the hole 114. The bit line contact 206 is composed of a titanium silicide film 116, a titanium nitride film 117, and a tungsten film 118. A bit line 207 is formed from a tungsten nitride film 119 and a tungsten film 120 to connect with the bit line contact. The bit line is covered with an interlayer insulating film 121.

Contact holes are provided in predetermined regions of the interlayer insulating film 113 and 121 to connect to the drain 108 of the transistor 106 and the drain 112 of the transistor 107, respectively. Each hole is filled with a conductive polysilicon film to form a silicon plug 122. A plug contact 212 is formed in the top portion of the silicon plugs 122. Thus, a second plug contact portion is formed. A capacitor is formed to connect to the second plug contact portion.

The interlayer insulating film 123 is formed on the interlayer insulating film 121 in the peripheral circuit area. The interlayer insulating film 123 is used to form lower electrodes in the memory array area and is removed when capacitors are formed. After a lower electrode 124 of a crown structure is formed in the memory array area, a dielectric film 125 is formed to cover the lower electrode 124. An upper electrode 126 is formed to cover the whole memory array area. Thus, the capacitors are completed. The capacitors are covered with an interlayer insulating film 127.

On the other hand, transistors for the peripheral circuit are formed in the second P-well 104. The transistor has a source 109, a drain 112, a gate insulating film 110, and a gate electrode 111. A contact hole 128 is formed in a predetermined region of the interlayer insulating film 113 to connect to the drain 112. After a titanium silicide film 116 is formed, the contact hole is filled with a titanium nitride film 117 and a tungsten film 118. After the contact hole is filled, a tungsten nitride film 119 and a tungsten film 120 are formed to form a first wiring layer. A part of the first wiring layer is connected to a second wiring layer through a contact. A contact hole 129 is provided to pass through the interlayer insulating film 121, the interlayer insulating film 123, and the interlayer insulating film 127. After a titanium nitride film 130 is formed in the contact hole, the contact hole is filled with a tungsten film 131. The second wiring layer is composed of a titanium nitride film 132, an aluminum film 133, and a titanium nitride film 134.

A part of the upper electrode 126 for the capacitor formed in the memory array area extends to the peripheral circuit area as a lead wiring 135. A contact hole is formed in a predetermined region of the interlayer insulating film 127 to connect to the lead wiring 135. The contact hole is filled with a tungsten film 137 after being filled with a titanium nitride film 136. The contact is connected to the second wiring layer.

A DRAM is manufactured by repeating the processes of forming interlayer insulating films, forming contacts, and forming wiring layers, thereafter.

FIRST EMBODIMENT

Next, the structure and manufacturing method of a capacitor in a DRAM as an example of the semiconductor integrated circuit device of the present invention will be described in detail with reference to FIGS. 4A to 4J. In the above description, the interlayer insulating film 123 is formed on the interlayer insulating film 121 and the dielectric film is formed on the interlayer insulating film 121 between the capacitors. In the following manufacturing method, however, an additional interlayer insulating film is formed between the interlayer insulating film 121 and the interlayer insulating film 123. In this case, the additional interlayer insulating film is removed from the area where the second plug contact portion is formed.

Figure 4A:
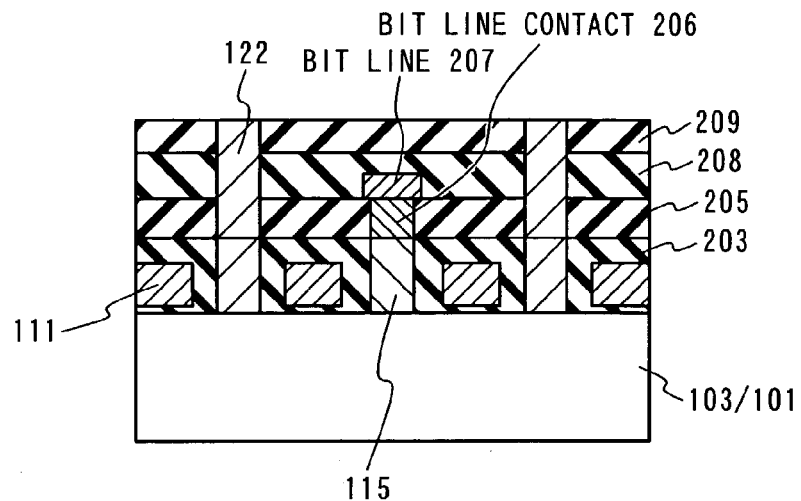
FIGS. 4A to 4J are cross-sectional views showing a process of manufacturing the semiconductor integrated circuit device according to the first embodiment of the present invention.

As shown in FIG. 4A, word lines 111 are formed on the silicon substrate 101 or the P-well 103 via an insulating film. These word lines correspond to the gates of the transistors in FIG. 3. After a first interlayer insulating film 203 is formed to cover the word lines, the contact hole 114 is formed to pass through the first interlayer insulating film 203 to the common source 109 of the transistors. The contact hole 114 is filled with conductive polysilicon to form the first silicon plug 115. Subsequently, a second interlayer insulating film 205 is formed on the first interlayer insulating film 203. After that, the bit line contact 206 is formed in the second interlayer insulating film 205 to connect to the first silicon plug, and the bit line 207 is formed on the second interlayer insulating film 205 to connect to the bit line contact 206.

Next, a third interlayer insulating film 208 of silicon oxide is formed on the second interlayer insulating film 205 to cover the bit line 207. A fourth interlayer insulating film 209 of silicon nitride is formed on the third interlayer insulating film. Contact holes are formed to pass through the first interlayer insulating film 203, the second interlayer insulating film 205, the third interlayer insulating film 208, and the fourth interlayer insulating film 209 to the drain 108 of the transistor 106 and the drain 112 of the transistor 107. The holes are filled with conductive polysilicon to form the silicon plugs 122.

Figure 4B:
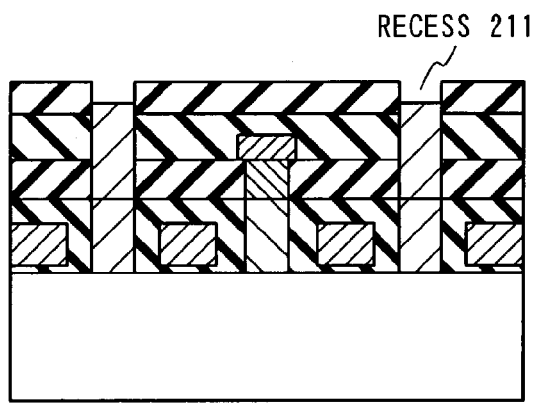

Next, as shown in FIG. 4B, recesses 211 are formed by etching the silicon plugs 122 to the depth of about half the thickness of the fourth interlayer insulating film 209 of silicon nitride.

Figure 4C:
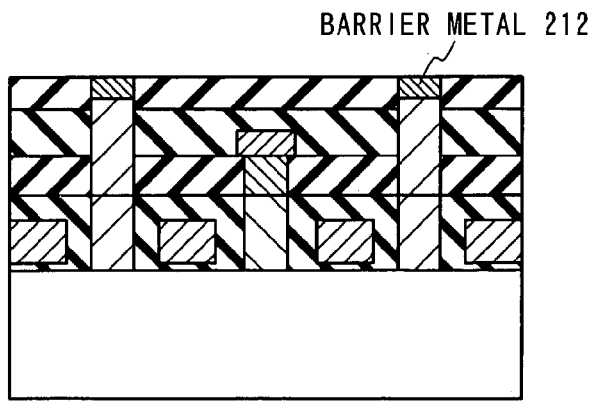

Next, as shown in FIG. 4C, a titanium nitride film is formed over the whole surface so that the recesses 211 are filled up sufficiently, and then the titanium nitride film on the surface other than the recess areas is removed. Thus, barrier metal layers 212 are formed in the recess areas. The barrier metal layers 212 are provided for the purpose to prevent the plug silicon from reacting with the ruthenium film which will be formed later. It is preferable to form the barrier metal layers 212 by a CVD method which is excellent in coverage.

Figure 4D:
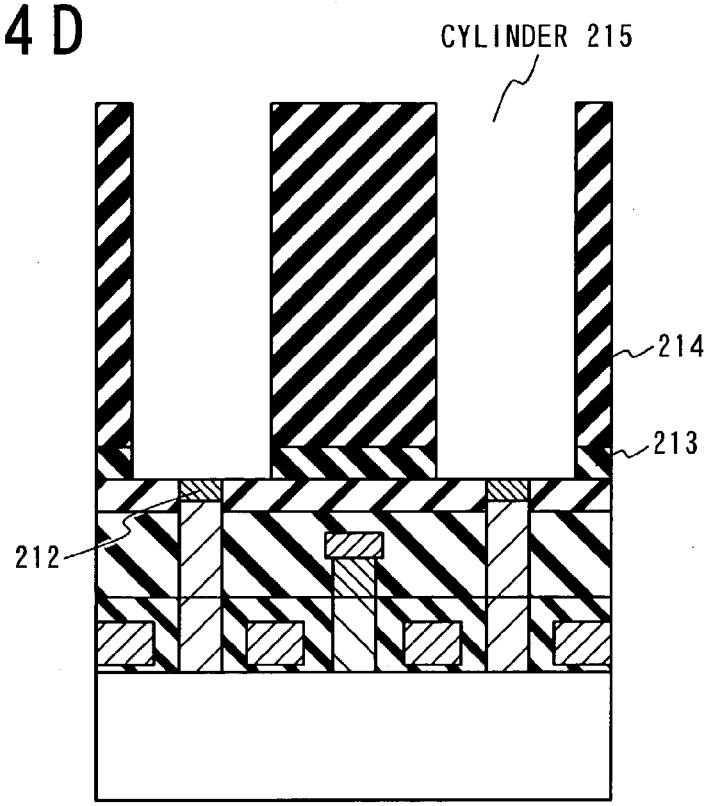

Next, as shown in FIG. 4D, a fifth interlayer insulating film 213 of silicon nitride is formed and then a sixth interlayer insulating film 214 of silicon oxide is formed to have the thickness of about 1.5 µm. The insulating films 213 and 214 correspond to the interlayer insulating film 123 in FIG. 3. After that, cylinders 215 are formed in predetermined regions of the fifth and sixth interlayer insulating films to reach the barrier metals.

Figure 4E:
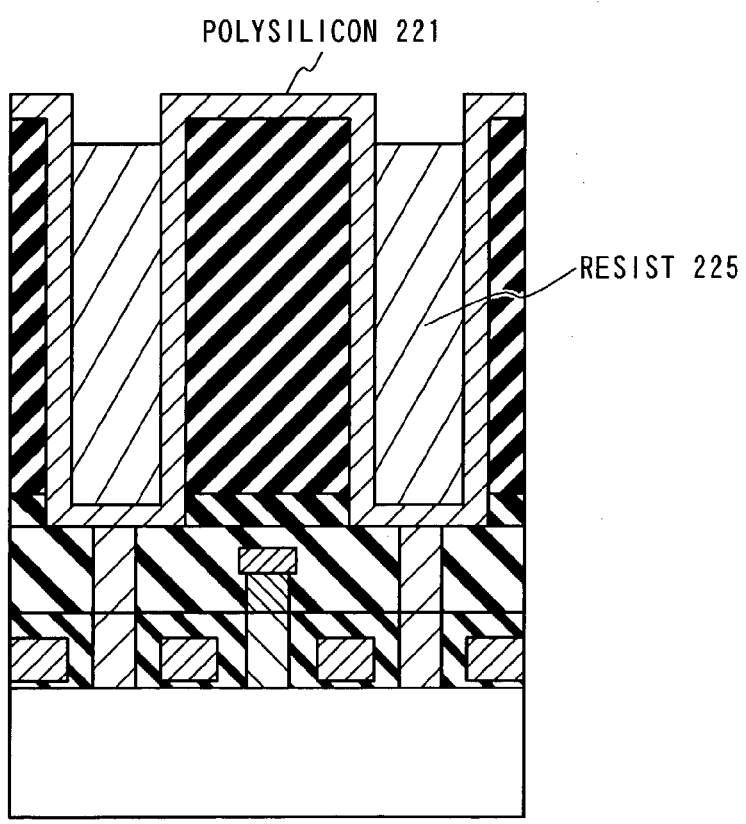

Thereafter, as shown in FIG. 4E, after the formation of the cylinders, a conductive polysilicon film 221 is formed and the inside of the cylinders are filled with resists 225. The height of the cylinder is about 1.6 µm and the inner diameter of the cylinder is 0.2 µm after the formation of the polysilicon film.

As shown in FIG. 4E, the conductive polysilicon film 221 is deposited as an amorphous silicon film and then converted into a polysilicon film through heat treatment. The amorphous silicon film is deposited in a thickness of 30 nm at 530° C. by using monosilane ($SiH_4$) as a material gas while introducing phosphine ($PH_3$). After that, the amorphous silicon film is subjected to a heat treatment for 2 minutes at a temperature of 700° C. and is converted into the polysilicon film.

Figure 5:
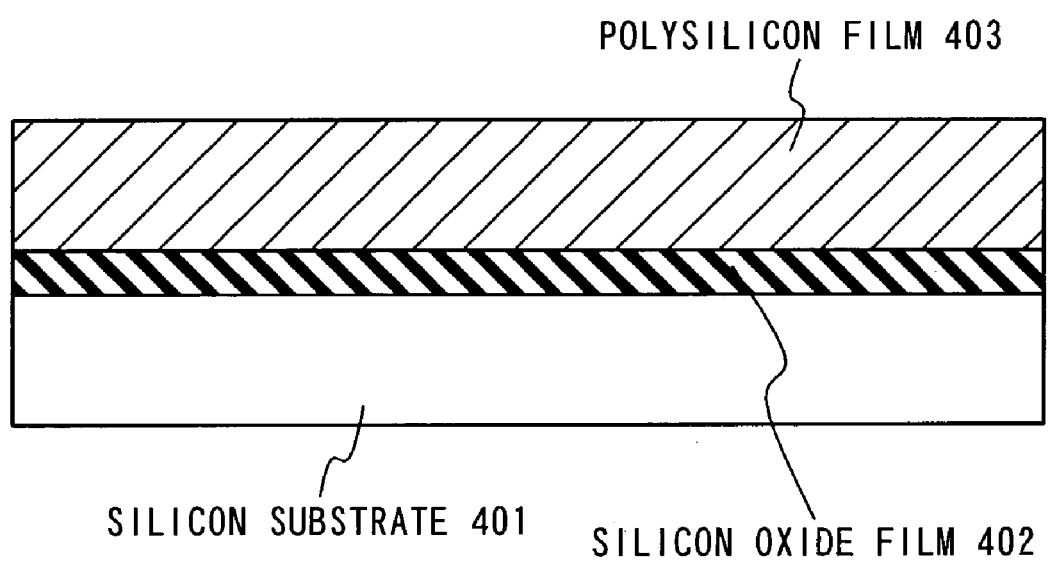
FIG. 5 is a cross-sectional view showing the transformation of an amorphous silicon film into a polysilicon film in the process of manufacturing the semiconductor integrated circuit device according to the first preferred embodiment of the present invention.

FIG. 5 schematically shows an observation of the cross section of a silicon film which is formed as an amorphous film by the CVD method and then is crystallized into a polysilicon film through the heat-treatment. A silicon oxide film 402 is formed on a silicon substrate 401. The amorphous silicon film of 30 nm in thick is deposited on the silicon oxide film. The temperature during the deposition is 530° C. After that, the amorphous silicon film is heat-treated for about 2 minutes at the temperature of 700° C. to convert into a polysilicon film 403. As seen from FIG. 5, the polysilicon film converted from the amorphous silicon film does not have a local thin portion or voids inside. Therefore, an electrode with a crown structure is formed by using the polysilicon film as a base material film, and then a ruthenium film is formed on the polysilicon film. In this case, it is possible to improve the mechanical strength of the lower electrode.

Figure 4F:
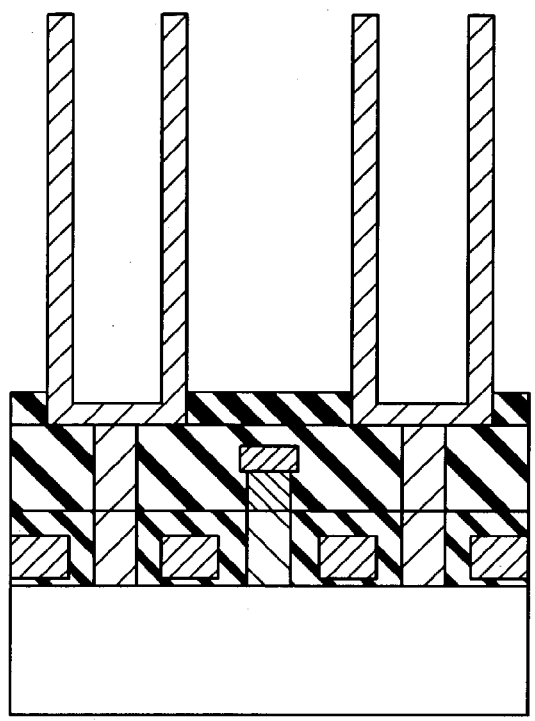

Next, as shown in FIG. 4F, the polysilicon film 221 is removed from the regions other than the cylinders by using an anisotropic dry etching. Then, the resists 225 filling the holes are also removed. Etching liquid which has, as a main component, organic acid as phenol-alkyl-benzen-sulfone acid, for example, can be used for removing the photo resists. Furthermore, a thick silicon oxide film 214 around the cylinders can be removed by a wet etching using an etching liquid which has hydrofluoric acid as a main component. The fifth interlayer insulating film 213 which is formed of silicon nitride and is etched with difficulty by hydrofluoric acid, is provided under the silicon oxide film 214. Therefore, the etching can stop there. In this manner, the crown structure of polysilicon is formed. It is also possible to apply the generally used oxygen ashing method to remove the resists.

Figure 4G:
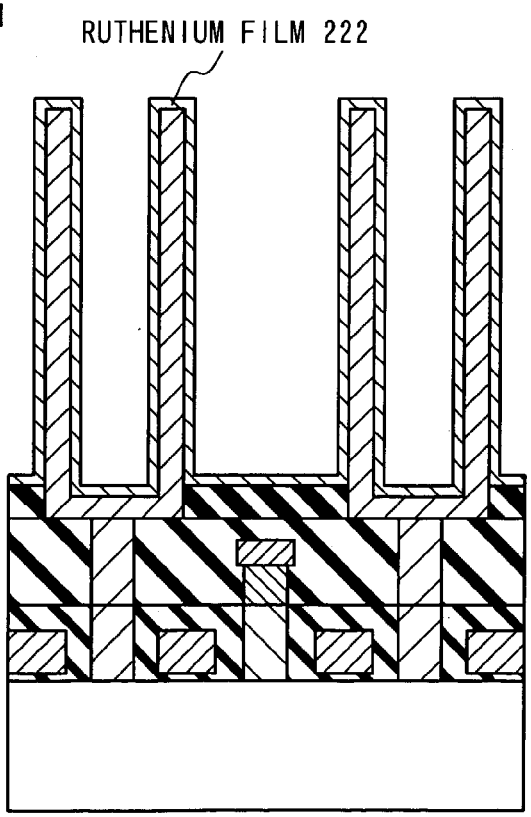

Next, as shown in FIG. 4G, a ruthenium film of about 5 nm is formed over the whole surface by a sputtering, and then a ruthenium film 222 of about 30 nm in thick is formed by a CVD method. The ruthenium film formed by the sputtering method is used as the seed crystal for the ruthenium film which is formed by the CVD method. The sputtered ruthenium film is basically very thin at the bottom of the holes due to its scarce coverage, but it is good enough to be used as the seed crystal.

The CVD formation of the ruthenium film can be carried out by vaporizing ethyl-cyclo-penta-dienyl-ruthenium (Ru $[C_2H_5C_5H_4]_2$: noted as $Ru(EtCp)_2$, hereinafter) diluted suitably with solvent such as tetra-hydro-furan (THF) into a material gas, and by reacting the material gas with oxygen at the temperature of about 300° C. The sputtered ruthenium film plays a role of the seed crystal in forming the ruthenium film by the CVD method.

The CVD ruthenium film is not a continuous film immediately after its deposition. Therefore, heat-treatment is carried out for about 1 minute at the temperature of 600° C. in a non-oxidizing atmosphere or a reducing atmosphere to improve its continuity.

Figure 4H:
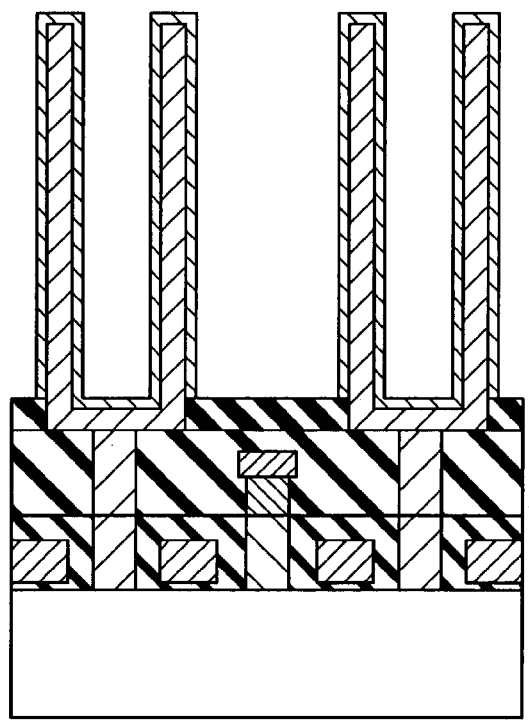

After that, as shown in FIG. 4H, the ruthenium film around the crown structures is removed by the above-mentioned anisotropic dry etching to form the crown-type lower electrode 124 whose surface layer is the ruthenium film.

Figure 6A:
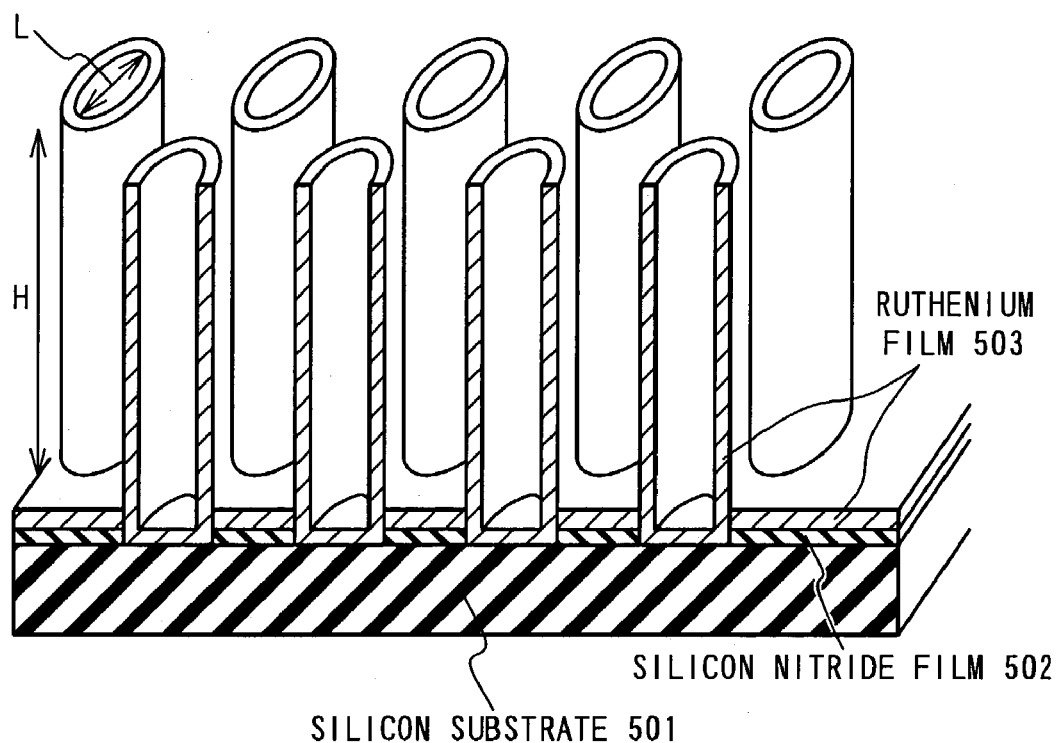
FIGS. 6A and 6B are cross-sectional views showing crown structures before and after a plasma etching is applied to ruthenium film in the process of manufacturing the semiconductor integrated circuit device according to the first preferred embodiment of the present invention.
Figure 6B:
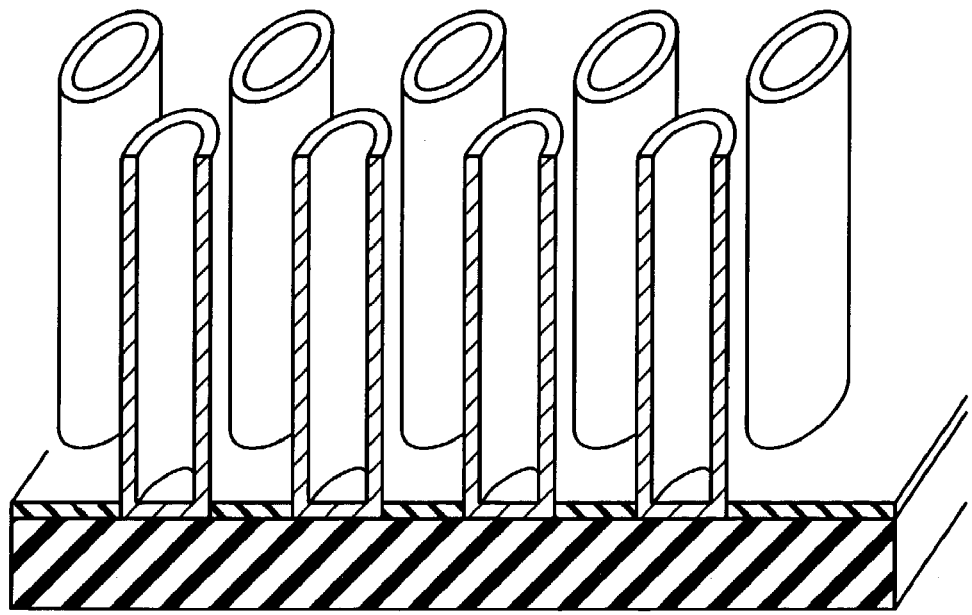

The reason why the ruthenium film around the electrodes can be removed selectively by the dry etching will be described referring to FIGS. 6A and 6B and FIG. 7. FIG. 6A is a perspective view of the state of a substrate when a ruthenium film is formed over the surface after the crown-type structures of polysilicon are formed. The crown-type structures of polysilicon (not shown) are formed in the predetermined areas on a silicon oxide film 501. A silicon nitride film 502 is formed on the silicon oxide film 501 between the crown-type lower electrodes 124. The whole surface is covered with a ruthenium film 503.

Figure 7:
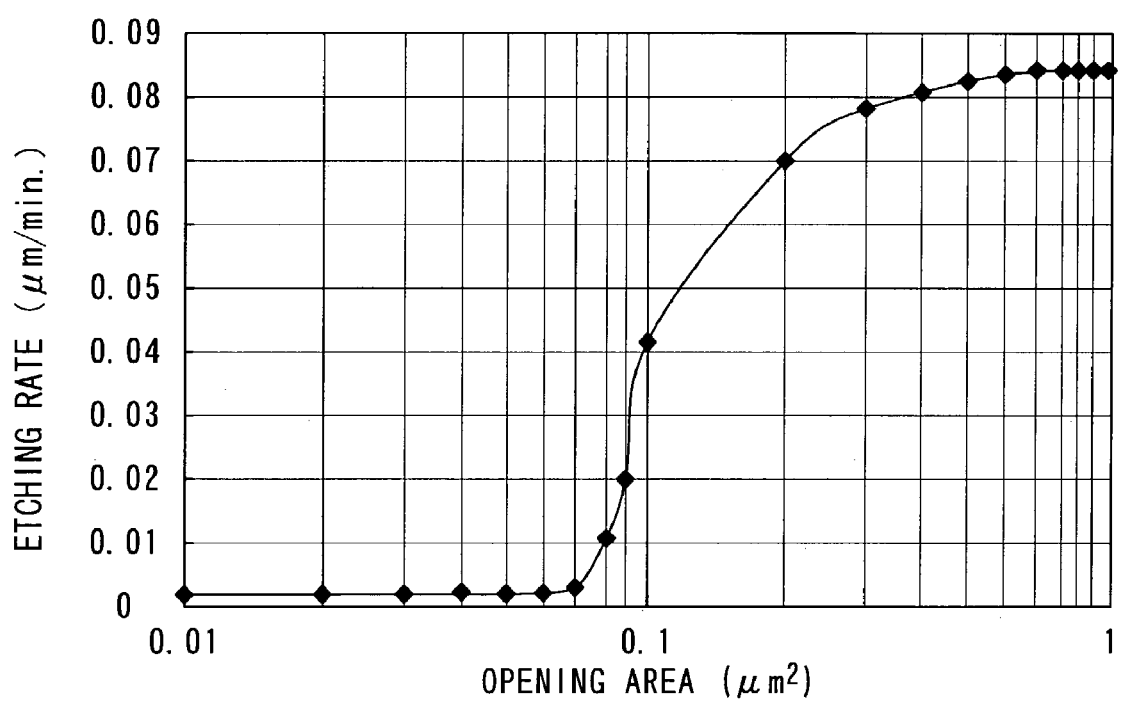
FIG. 7 is a graph showing that the ruthenium film can be removed by the plasma etching, in the process of manufacturing the semiconductor integrated circuit device according to the first embodiment of the present invention.

FIG. 7 shows an example of the dependence of the dry etching rate of a ruthenium film at the bottom of a hole on the inside diameter L (the opening area) of a crown structure, when the height H of the crown structure after the formation of the ruthenium film is 1.6 µm. The inside diameter L (or the opening area) is changed variously according to the samples. The dry etching is carried out under the condition that the etching gas is oxygen, the pressure is 1.0 Pa, and the high frequency power is 800 W. The etching rate is about 0.08 µm/min when the opening area is 0.31 square µm (L=2.0 µm), while it becomes extremely low and substantially no etching occurs when the opening area becomes as small as 0.07 square µm (L=0.3 µm).

While this result depends on the condition under which the etching is carried out, it shows that the anisotropic dry etching can generally accomplish the removal of ruthenium film in the larger area while the ruthenium film in the comparatively smaller area at the bottom of the hole remains. Therefore, the ruthenium film can remain sufficiently at the bottom of the hole when the opening area is as small as about 0.07 square µm. FIG. 6B shows a case where surroundings of the crown structures correspond to the extremely large area, and the ruthenium film around the crown structures is removed while the ruthenium film is remaining at the bottom of the crown structures.

The selective growth of a ruthenium film to be described later can be also used to separate the lower electrodes instead of the anisotropic selective dry etching mentioned above. That is to say, it is possible to deposit ruthenium films under the condition that the ruthenium films grow only on the crown structures of polysilicon and not on the other areas.

Figure 4I:
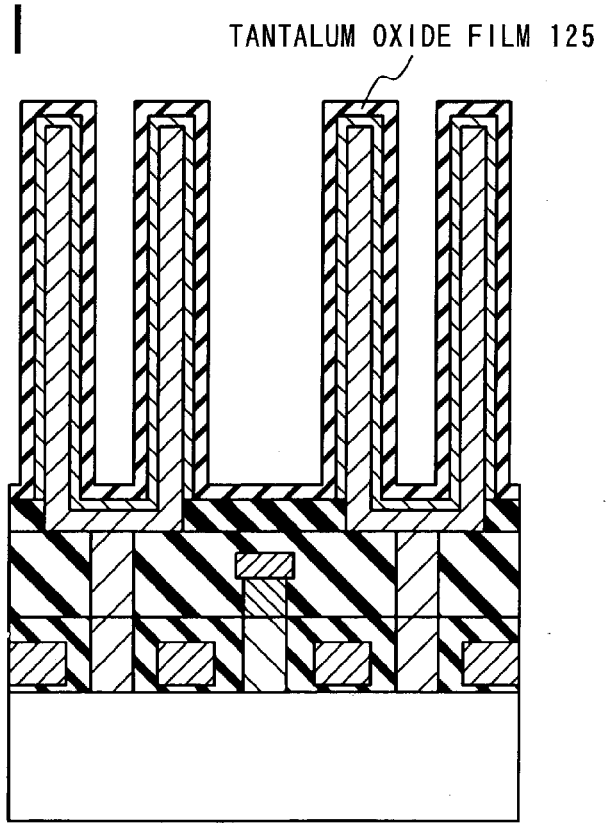

Next, as shown in FIG. 4I, a tantalum oxide film 125 of 12 nm in thick is formed as a dielectric layer. The formed tantalum oxide film is heat-treated to reduce leakage current. The tantalum oxide film is first heat-treated in the atmosphere of about 400° C. which contains active oxygen (atmosphere which contains ozone or plasma atmosphere which contains oxygen and so on). After that, the second heat-treatment is carried out in the non-oxidizing atmosphere to crystallize a tantalum oxide film. The temperature is 700° C. and the duration is 1 minute. It is more effective for reducing the leakage current to repeat the deposition of tantalum oxide films and the heat-treatments several times.

Figure 4J:
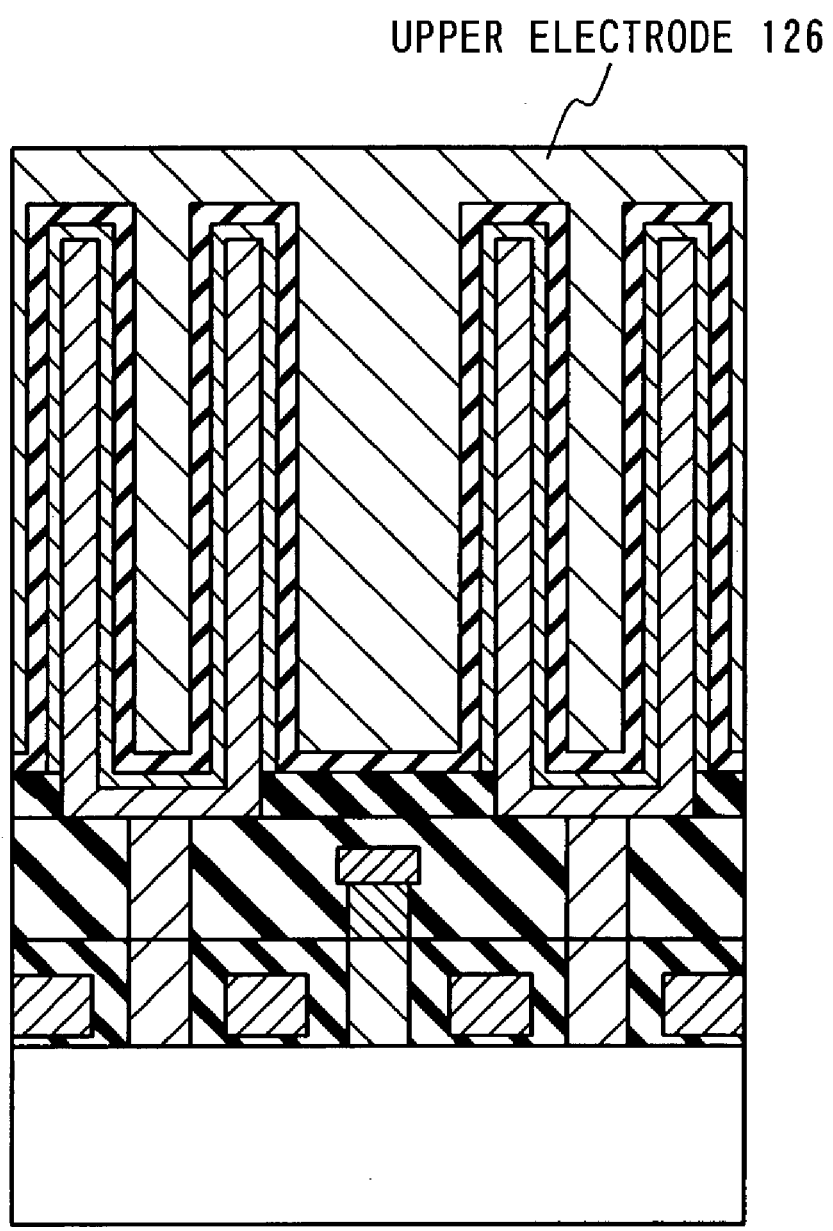

Next, as shown in FIG. 4J, a ruthenium film is formed by the CVD method after the seed crystal is formed by the sputtering method, and is heat-treated at a temperature of 450° C. to improve its evenness. After that, a tungsten (W) film of about 100 nm in thick is deposited by the sputtering method to form an upper electrode 126. Next, the wiring lines are formed in the similar way to the conventional example.

An example is described in the first embodiment in which the ruthenium film, which has some advantages in using the tantalum oxide film as the dielectric layer, is formed on a conductive polysilicon film as the center film of the crown-type electrode. However, the center film of the crown-type electrode is not limited to a polysilicon film. Any of metal, metal compound, and metal silicide such as titanium silicide other than ruthenium can be also used for the center film. Also, it is possible to form a ruthenium film after forming metal silicide on the surface of the polysilicon film. For example, a titanium film of about 4 nm in thickness is grown after the crown structure of polysilicon is formed, and then is heat-treated at the temperature of 600° C. for 1 minute, resulting in the formation of a titanium suicide film of about 8 nm in thickness on the surface of a polysilicon film.

In the art disclosed in Japanese Laid Open Patent Application (JP-A-Heisei 11-274431), unevenness is provided at a base metal electrode to enlarge the surface area of the lower electrode, and a ruthenium film is formed on its surface to improve the oxidation resistance. In order to achieve such a structure, (1) unevenness is formed on the base metal electrode by the wet etching, and (2) a ruthenium film is grown by the CVD method. However, such a manufacturing process is difficult to control because the unevenness is formed by the wet etching method to the electrode itself. In an extreme case, some etching portions penetrate the electrode because the etching occurs at both sides of the electrode, resulting in the remarkable loss of the mechanical strength. In order to form unevenness with the size enough to embody the effect while avoiding such problems, the thickness of an electrode before the etching must be sufficient (more than 100 nm). In that case, however, the hole of the electrode disappears. Such a structure is unsuitable for the highly integrated circuit in which the electrode film is required to be as thin as about 30 nm. In the present invention, on the other hand, a thin film can be obtained because unevenness is not formed.

SECOND EMBODIMENT

The semiconductor device according to the second embodiment of the present invention will be described referring to FIGS. 8A and 8B. In the first embodiment, the example is described in which the polysilicon film or/and the metal silicide film are formed below the ruthenium film. In the second embodiment, however, an example will be described in which a metal film or metal compound is used instead of the polysilicon film.

In case where a ruthenium film is formed on a metal film or a metal compound film as a base film and the selective anisotropic dry etching is applied, the ruthenium film on the top of crown structure is removed while the ruthenium film top of crown structures is removed. As a result, the base film is exposed and contacts directly with the dielectric layer of tantalum oxide. Such a situation does not matter when the base film material is polysilicon or silicide, while increase in leakage current is inevitable when the base film material is a metal layer or a metal compound layer. Therefore, the exposure of the base film is inappropriate for the tantalum oxide film.

Figure 8A:
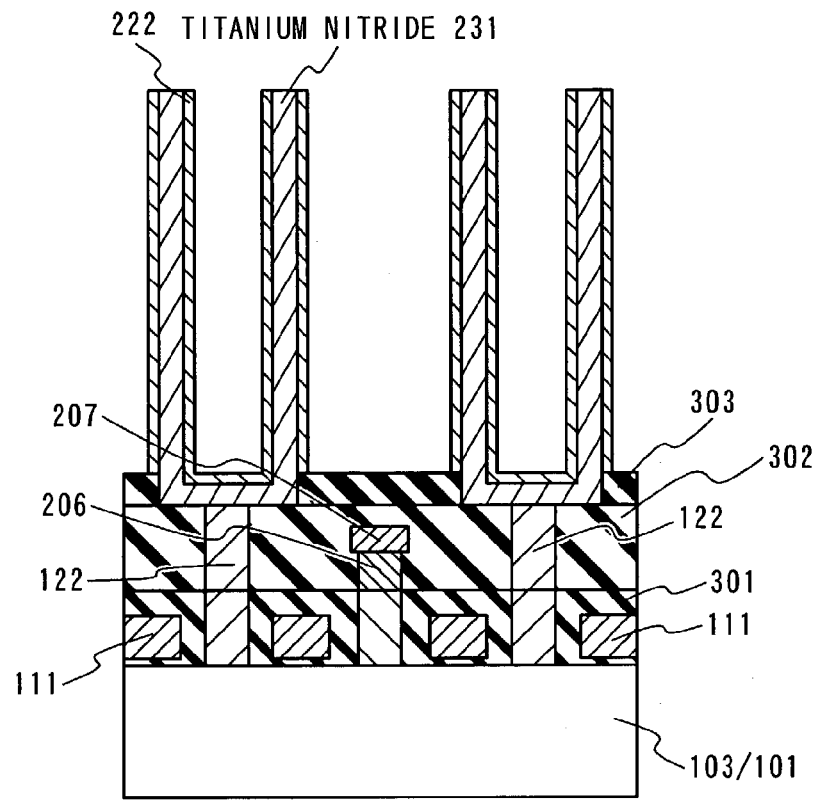
FIGS. 8A and 8B are cross-sectional views showing a process of manufacturing the semiconductor integrated circuit device according to a second embodiment of the present invention.

In FIG. 8A, a crown-type structure is formed by using a titanium nitride film 231 instead of the polysilicon film and then a ruthenium film 222 is formed on the whole surface in the similar way to the first embodiment. Next, the ruthenium film 222 around the crown structures is removed by the selective anisotropic dry etching. In this case, the ruthenium films on the top of the crown structures are also etched at the same time.

Figure 8B:
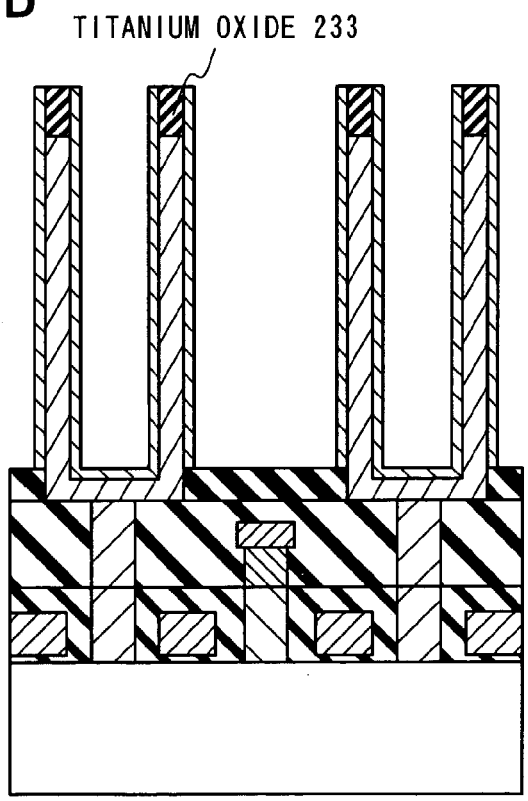

In FIG. 8B, the exposed titanium nitride films are transformed into titanium oxide films 233. The transformation is achieved by heat-treating the exposed titanium nitride films in the oxygen atmosphere for 1 minute at the temperature of 450° C. While the ruthenium films 222 are also exposed in the oxygen atmosphere at the same time, the ruthenium films 222 are never transformed into the ruthenium oxide because a temperature of more than 500° C. is necessary for the formation of ruthenium oxide. After that, capacitors are formed in the same manner as the first embodiment, i.e., through the forming of a tantalum oxide film and the forming of an upper electrode.

The increase in leakage current when the tantalum oxide film contacts a base film is caused by the insufficient transformation of tantalum oxide at the time of heat-treating in the oxidizing atmosphere because the oxidizer is consumed by the base film which can be oxidized more easily than tantalum. Therefore, it is proper to oxidize the metal or metal compound of the base film previously so that the oxidizer is not consumed.

According to the second embodiment, even when the top portion of crown structure is etched by the selective anisotropic dry etching and the base film material is exposed, the base film material has been transformed into an oxide film previously. After that, the tantalum oxide film is formed as a dielectric film. This method makes it possible to reduce the leakage current with ensuring the mechanical strength even in case of a crown-type lower electrode whose base film under a ruthenium film is formed of metal or metal compound.

THIRD EMBODIMENT

Next, a semiconductor integrated circuit device according to the third embodiment of the present invention will be described. In the third embodiment, a ruthenium film is grown selectively by the CVD method. Thus, a ruthenium film is formed on the surface of the polysilicon film.

Figure 10:
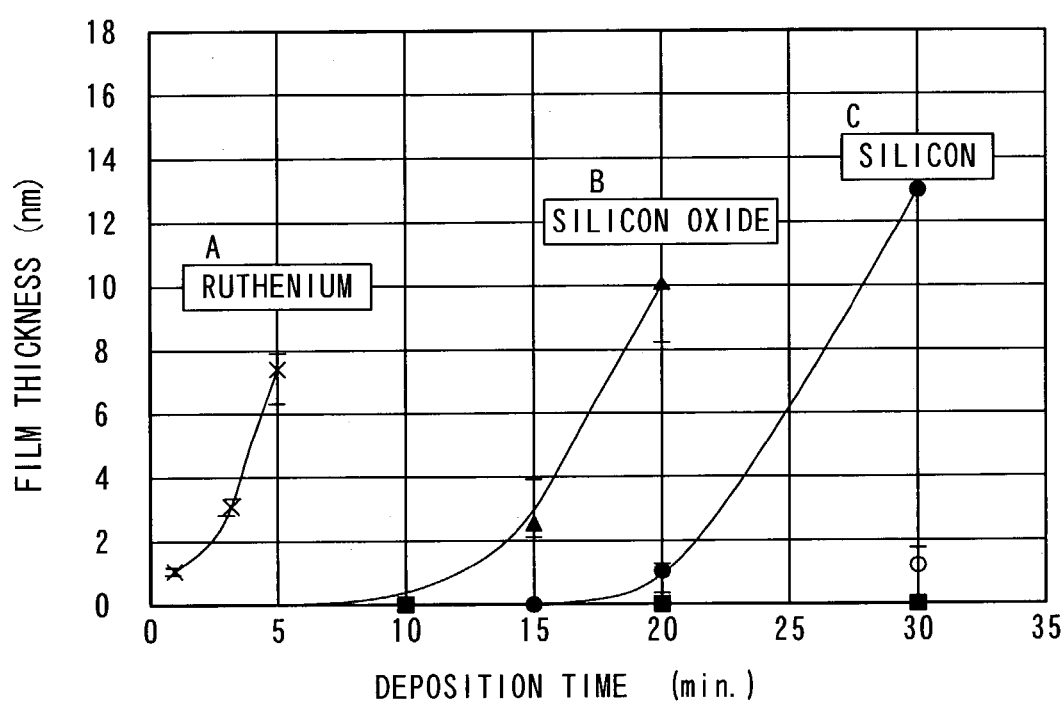
FIG. 10 is a graph showing selective growth of a ruthenium film in the process of manufacturing the semiconductor integrated circuit device according the third embodiment of the present invention.

First, FIG. 10 shows the dependency of the growth of a ruthenium film by the CVD on the base film material. The vaporized gas of Ru(EtCp)$_2$ diluted by THF was used as a material gas, as a conventional example. The flow rate was 5 sccm. Simultaneously, oxygen with the flow rate of 50 sccm was supplied as a reaction gas. The temperature was 295° C. and the pressure was 60 Pa. Samples were prepared such as a silicon substrate, a silicon oxide film, a titanium nitride film, a titanium silicide, a tantalum oxide, a tantalum nitride, and a ruthenium film formed by a sputtering method as the base film materials. The deposition of a ruthenium film is tried on each sample under the same condition. The dependence of the film thickness of the deposited ruthenium film on the elapsed time (deposition time) from the beginning of the gas supply was examined. The film thickness was determined by the X-ray measuring method.

As shown in FIG. 10, a ruthenium film began to grow on the sputtered ruthenium film at nearly the same time of the gas supply without time delay (A in the figure). On the other hand, a film began to grow 10 minutes and about 20 minutes after the gas supply on the silicon oxide film (B in the figure) and the silicon film (C in the figure), respectively. No film was deposited substantially on the other film materials even after 30 minutes passed. This result shows that it is possible to selectively form a ruthenium film only on a target material film by selecting the base film material and the deposition time.

In the third embodiment, the base crown structure is formed by a conductive polysilicon film 221. In this case, it is necessary that the ruthenium film 222 is formed only on the polysilicon film and not around the crown structures. Therefore, the material which exposes around the crown structures should be an insulating film and have a characteristic that the growth rate of the ruthenium film on it is lower than that on the polysilicon film 221. Based on the results described above, a tantalum oxide film can be chosen.

Figure 9A:
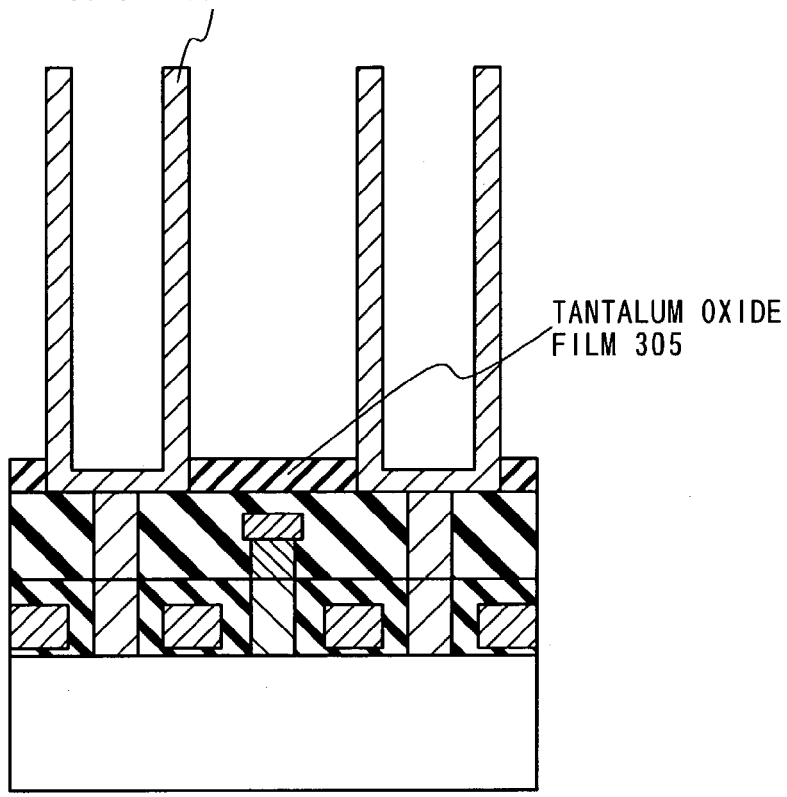
FIGS. 9A and 9B are cross-sectional views showing a process of manufacturing the semiconductor integrated circuit device according to a third embodiment of the present invention.
Figure 9B:
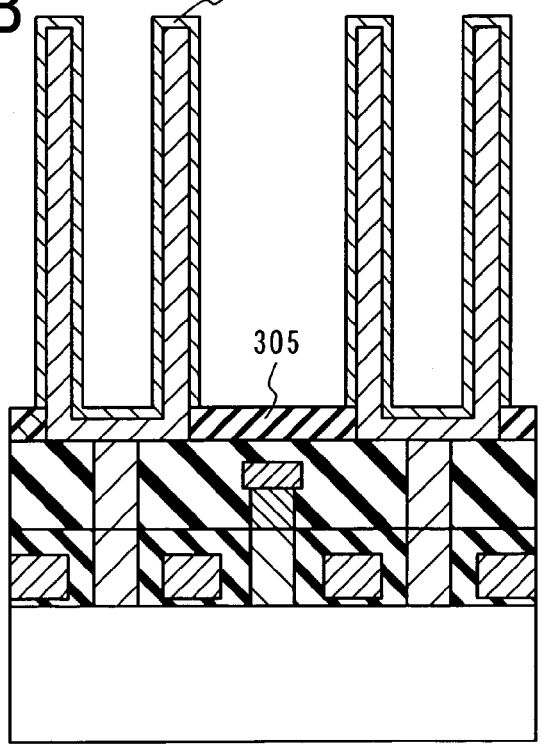

FIGS. 9A and 9B are schematic diagrams showing the third embodiment. A silicon nitride film is provided under a thick silicon oxide film used for the formation of cylinders in the conventional example and the above-described embodiments. In the third embodiment, a tantalum oxide film 305 is formed instead of a silicon nitride film. Or, a tantalum oxide film 305 is laminated on a silicon nitride film. The setting of the film thickness is discretionary, and it is set to be 20 nm in this example. The tantalum oxide film 305 is formed by the CVD method under the same condition as a tantalum oxide is formed as dielectric layer. A tantalum oxide film like the silicon nitride film is also hard to be etched by hydrofluoric acid. Therefore, it is possible to remove the thick silicon oxide film by the wet etching method.

As shown in FIG. 9A, a crown structure of polysilicon 221 is formed in the state that a tantalum oxide film 305 is exposed around the crown structures. Next, as shown in FIG. 9B, a ruthenium film 222 is formed by the method mentioned above. The film deposition time is 23 minutes. The ruthenium film 222 of about 4 nm in thick is formed on the surface of the polysilicon film which is the center film of the crown structure. No deposition of ruthenium is found on the surface of the tantalum oxide film 305 around the crown structures (FIG. 9B). After that, a capacitor is formed in the same manner as the above embodiments, i.e., through the forming of the dielectric film and the forming of the upper electrode.

According to the present embodiment, the ruthenium film can be formed only on the surface of polysilicon film of the crown structure by using the selective growth method which utilizes the dependence of the growth rate of ruthenium on the base film material. Therefore, it is possible to avoid the loss of the top portions of crown structures during the etching and to form crown-type lower electrode whose surface film is the ruthenium film with the sufficient mechanical strength and no collapse.

FOURTH EMBODIMENT

Figure 11:
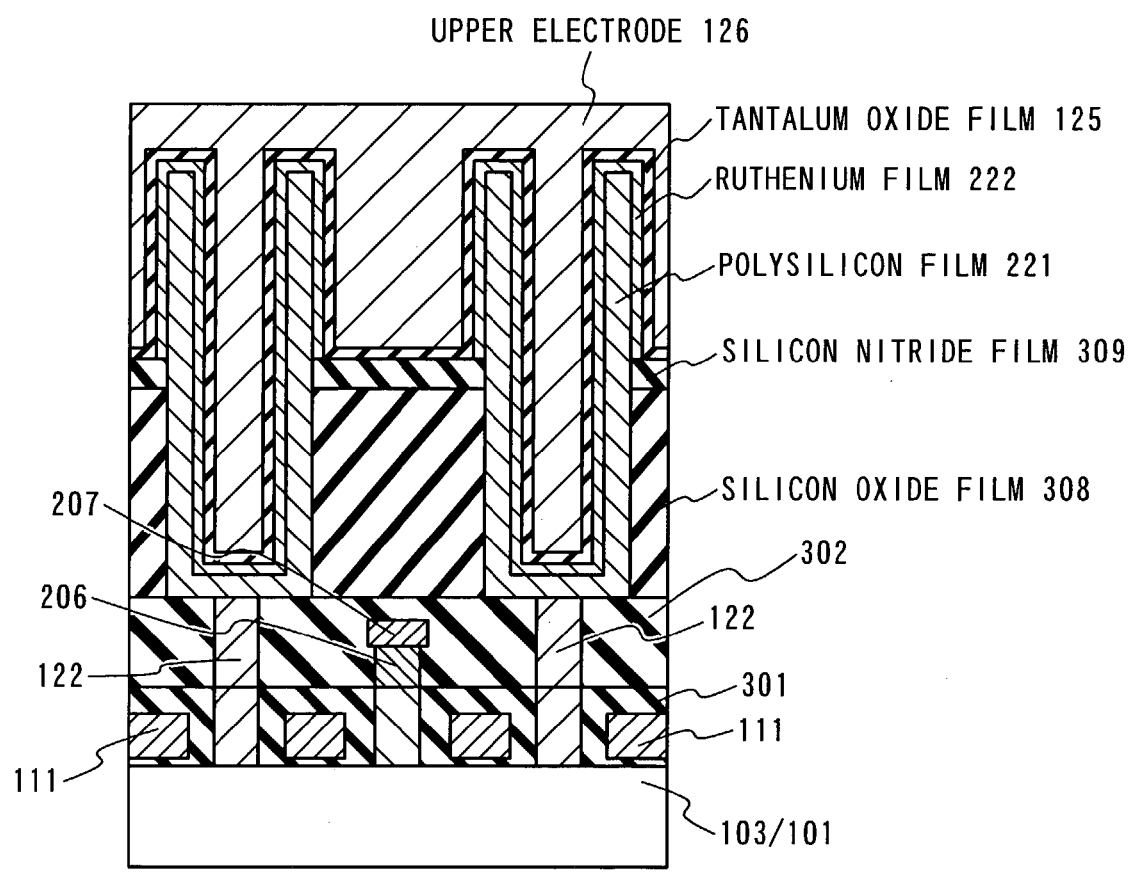
FIG. 11 is a cross-sectional view showing a process of manufacturing the semiconductor integrated circuit device according to a fourth preferred embodiment of the present invention.

Next, the fourth embodiment will be described. FIG. 11 shows an example that an insulating film 308 between the crown structures is remaining to some extent, a half-shaped crown structure of polysilicon or silicide is formed, and then the ruthenium film is formed according to the embodiments mentioned above.

A thick silicon oxide film 308 is formed for a half of a predetermined thickness and then a silicon nitride film 309 of 50 nm thick is laminated on it. Another silicon oxide film is formed for the remainder of the determined thickness. After that, cylinders are formed. A polysilicon film 221 of 30 nm in thick is formed on the inner wall of each cylinder. After that, the wet etching is applied to silicon oxide to form the crown structures.

In the fourth embodiment, the silicon nitride film is formed in a middle portion of the thick silicon oxide film as an etching stopper. Therefore, the etching stops in the surface of the silicon nitride film to form a half-embedded crown structures. After that, as mentioned above, a ruthenium film 222 is formed for the lower electrode. Next, the dielectric film of tantalum oxide 125 and the upper electrode 126 are formed. Thus, capacitors are formed.

According to the fourth embodiment, an insulating film remaining around the crown structures makes it possible to form the mechanically strong lower electrode with more tolerance to the collapse, which may depend on the capacitance required to assure the performance of the product.

As described above, in the semiconductor integrated circuit device of the present invention, a ruthenium film is provided after a base crown structure is formed with silicon and/or metal silicide for the crown-type lower electrode.

Also, for separation of a capacitor cell, such methods may be used that the area around the crown structures is selectively etched by utilizing the dependence of the dry etching rate on the opening area of the deep hole or the ruthenium film is selectively formed on only the base electrode by utilizing the dependence of the growth rate of ruthenium on the base material in CVD method.

Also, the collapse of the electrode can be prevented when the crown-type lower electrode is formed because the ruthenium film weak mechanically originally is formed on the surface of silicon or metal silicide formed densely and excellent in mechanical strength.

Also, the separation of electrodes can be achieved by removing the ruthenium film around the crown structures selectively by utilizing the dependence of the dry etching rate of ruthenium on the opening area of the hole of the crown structure.

Moreover, in the present invention, the base electrode is formed previously of silicon and/or silicide whose surface morphology is smooth and mechanical strength is excellent. It is possible to avoid such problems of the CVD ruthenium as poor morphology, damage of electrodes caused by the deterioration of the mechanical strength due to voids within films, and collapse, resulting in the improvement in the yield.

In the present invention, the ruthenium film is deposited after the crown-type lower electrode of polysilicon is formed. Thus, the ruthenium film is formed on the area other than an area where a polysilicon film is formed. For this reason, it is necessary to remove the ruthenium film formed on the area other than the area where the polysilicon film is formed in order to control each memory cell as an electrically independent cell. Since the selective anisotropic dry etching is used in the present invention, it is possible to separate the memory cells by removing the ruthenium film around the lower electrodes without etching the ruthenium film at the bottoms of the cylinder.

What is claimed is:

1. A method of manufacturing a semiconductor integrated circuit device comprising the steps of:
   (a) forming a second insulating film on a first insulating film;
   (b) removing said second insulating film partially;
   (c) forming at least one lower electrode on said first insulating film exposed after said second insulating film is removed partially, said lower electrode having a crown structure and comprising a plurality of conductive films,
   wherein an outermost film of said lower electrode is a ruthenium (RU) film, and a portion of said lower electrode other than said outermost film is a central film, and said central film has higher selective growth of said ruthenium film than said ruthenium film formed on said second insulating film;
   (d) forming a dielectric film on a surface of said crown structure and on said second insulating film between crown structures of lower electrodes formed in step (c); and
   (e) forming an upper electrode on said dielectric film, wherein said step of (b) removing comprises the steps of:
   (f) forming a third insulating film on said second insulating film; and
   (g) forming a plurality of holes passing through said second insulating film and said third insulating film to said first insulating film, and
   said step of (c) forming said lower electrode comprises the steps of:
   (h) forming said central film on an inner wall of each of said plurality of holes on said third insulating film;
   (i) removing said central film on said third insulating film;
   (J) removing said third insulating film; and
   (k) forming said ruthenium film on said central film, and wherein said step of (h) forming said central film comprises the steps of:
   forming an amorphous silicon film on said inner wall of each of said plurality of holes and on said third insulating film; and
   forming a conductive polysilicon film by heat-treating said amorphous silicon film.

2. The method of manufacturing a semiconductor integrated circuit device according to claim 1, wherein said step of (c) forming said lower electrode further comprises the step of forming suicide on a surface of said conductive polysilicon film.

3. A method of manufacturing a semiconductor integrated circuit device, comprising the steps of:
   (a) forming a second insulating film on a first insulating film, at least one of said first and second insulating films including tantalum oxide;
   (b) removing said second insulating film partially;
   (c) forming at least one lower electrode on said first insulating film exposed after said second insulating film is removed partially, said lower electrode having a crown structure and comprising a plurality of conductive films,
   wherein an outermost film of said lower electrode is a ruthenium (RU) film, and a portion of said lower electrode other than said outermost film is a central film, and said central film has higher selective growth of said ruthenium film than said ruthenium film formed on said second insulating film;
   (d) forming a dielectric film on a surface of said crown structure and on said second insulating film between crown structures of lower electrodes formed in step (c), said dielectric film being heat-treated in both an oxygen-containing atmosphere and a non-oxidizing atmosphere; and
   (e) forming an upper electrode on said dielectric flint, wherein said step of (b) removing comprises the steps of:
   (f) forming a third insulating film on said second insulating film; and
   (g) fanning a plurality of holes passing through said second insulating film and said third insulating film to said first insulating film, and
   said step of (c) forming said lower electrode comprises the steps of:
   (h) forming said central film on an inner wall of each of said plurality of holes on said third insulating film;
   (i) removing said central film on said third insulating film;
   (j) removing said third insulating film; and
   (k) forming said ruthenium film on said central film.

4. The method of manufacturing a semiconductor integrated circuit device according to claim 3, wherein said dielectric film is formed of tantalum oxide.

5. The method of manufacturing a semiconductor integrated circuit device according to claim 3, wherein said heat-treatment of step (d) is performed at about 700 degrees celsius for about one minute.

* * * * *